United States Patent
Nishimoto

(10) Patent No.: US 8,968,512 B2
(45) Date of Patent: Mar. 3, 2015

(54) TEMPERATURE ADJUSTING MECHANISM AND SEMICONDUCTOR MANUFACTURING APPARATUS USING TEMPERATURE ADJUSTING MECHANISM

(75) Inventor: Shinya Nishimoto, Hyogo (JP)

(73) Assignee: Tokyo Electron Limited, Tokyo (JP)

( * ) Notice: Subject to any disclaimer, the term of this patent is extended or adjusted under 35 U.S.C. 154(b) by 677 days.

(21) Appl. No.: 12/737,310

(22) PCT Filed: Jun. 30, 2009

(86) PCT No.: PCT/JP2009/061952
§ 371 (c)(1),
(2), (4) Date: Jan. 19, 2011

(87) PCT Pub. No.: WO2010/001890
PCT Pub. Date: Jan. 7, 2010

(65) Prior Publication Data
US 2011/0108195 A1 May 12, 2011

(30) Foreign Application Priority Data
Jul. 4, 2008 (JP) .................................. 2008-175590

(51) Int. Cl.
*C23C 16/511* (2006.01)
*C23C 16/52* (2006.01)
(Continued)

(52) U.S. Cl.
CPC ..... *H01L 21/67109* (2013.01); *H01J 37/32192* (2013.01); *H01J 37/32522* (2013.01); *H01J 37/32724* (2013.01)
USPC ............ 156/345.27; 156/345.24; 156/345.41; 156/345.42; 156/345.48; 156/345.49; 118/666; 118/723 MW; 118/724

(58) Field of Classification Search
CPC .... C23C 16/274; C23C 14/357; C23C 16/511
USPC ...... 118/723 MW, 723 MR, 723 MA, 723 M, 118/723 AN, 723 I, 666; 156/345.41–345.42, 345.48–345.49, 156/345.24, 345.27
See application file for complete search history.

(56) References Cited

U.S. PATENT DOCUMENTS
4,268,374 A * 5/1981 Lepselter ................. 204/298.31
4,534,816 A * 8/1985 Chen et al. ............... 156/345.37
(Continued)

FOREIGN PATENT DOCUMENTS
JP H07-321054 A 12/1995
JP H11-154600 A 6/1999
(Continued)

OTHER PUBLICATIONS
Office Action of Korea application No. 2010-7023085, mailed on Dec. 19, 2011, Total 6 pages.
(Continued)

*Primary Examiner* — Rudy Zervigon
(74) *Attorney, Agent, or Firm* — Pearne & Gordon LLP

(57) ABSTRACT

Provided is a temperature adjusting mechanism, which can keep deviation of a temperature of a portion in contact with the temperature adjusting mechanism to be small by controlling the temperature accurately at a high speed. A semiconductor manufacturing apparatus using such temperature adjusting mechanism is also provided. A cooling jacket (6) is provided with a cooling channel (61), and a heat lane (62). The heat lane (62) is provided with a heat receiving section (63), and a heat dissipating section (64), and seals a two-phase condensable working fluid (hereinafter referred to as the working liquid) in an annular narrow tube alternately folds back and forth therebetween. The heat dissipating section (64) is a portion to be cooled by the cooling channel (61), and the heat receiving section (63) is a portion having a temperature higher than that of the heat dissipating section (64). In the heat receiving section (63), heat is received, the working liquid is self-excited by nucleate boiling, and the working liquid transfers sensible heat while being circulated. Furthermore, in the heat receiving section (63), a liquid phase absorbs heat and the phase is transformed into a vapor phase, and in the heat dissipating section (64), a vapor phase dissipates heat and is cooled and condensed, the phase is transformed into a liquid phase, and latent heat is transferred by vapor-liquid phase transformation. Heat is transferred between the heat receiving section (63) and the heat dissipating section (64), and the temperature is uniformized in a short time.

17 Claims, 9 Drawing Sheets

(51) Int. Cl.
*C23F 1/00* (2006.01)
*H01L 21/306* (2006.01)
*H01L 21/67* (2006.01)
*H01J 37/32* (2006.01)
*C23C 16/06* (2006.01)
*C23C 16/44* (2006.01)

(56) References Cited

U.S. PATENT DOCUMENTS

| | | | |
|---|---|---|---|
| 4,612,077 A * | 9/1986 | Tracy et al. | 156/345.34 |
| 4,709,656 A * | 12/1987 | Fujiyama | 118/723 E |
| 4,719,873 A * | 1/1988 | Fujiyama | 118/723 E |
| 4,724,160 A * | 2/1988 | Arvidson et al. | 438/466 |
| 4,931,135 A * | 6/1990 | Horiuchi et al. | 216/67 |
| 5,079,481 A * | 1/1992 | Moslehi | 315/111.41 |
| 5,097,890 A * | 3/1992 | Nakao | 165/206 |
| 5,254,171 A * | 10/1993 | Hayakawa et al. | 118/723 MR |
| 5,254,176 A * | 10/1993 | Ibuka et al. | 134/2 |
| 5,273,588 A * | 12/1993 | Foster et al. | 118/723 E |
| 5,368,685 A * | 11/1994 | Kumihashi et al. | 216/70 |
| 5,414,324 A * | 5/1995 | Roth et al. | 315/111.21 |
| 5,439,715 A * | 8/1995 | Okamura et al. | 427/575 |
| 5,453,125 A * | 9/1995 | Krogh | 118/723 MR |
| 5,529,632 A * | 6/1996 | Katayama et al. | 118/723 MP |
| 5,545,258 A * | 8/1996 | Katayama et al. | 118/723 MP |
| 5,618,349 A * | 4/1997 | Yuuki | 118/715 |
| 5,645,644 A * | 7/1997 | Mabuchi et al. | 118/723 MW |
| 5,647,945 A * | 7/1997 | Matsuse et al. | 156/345.38 |
| 5,651,826 A * | 7/1997 | Takagi | 118/724 |
| 5,653,806 A * | 8/1997 | Van Buskirk | 118/715 |
| 5,804,923 A * | 9/1998 | Iio et al. | 315/111.21 |
| 5,846,883 A * | 12/1998 | Moslehi | 438/711 |
| 5,874,012 A * | 2/1999 | Kanai et al. | 216/67 |
| 5,893,962 A * | 4/1999 | Mizuno et al. | 118/723 E |
| 5,928,427 A * | 7/1999 | Hwang | 118/723 E |
| 5,950,925 A * | 9/1999 | Fukunaga et al. | 239/132.3 |
| 5,951,772 A * | 9/1999 | Matsuse et al. | 118/723 R |
| 5,951,923 A * | 9/1999 | Horie et al. | 261/153 |
| 6,001,175 A * | 12/1999 | Maruyama et al. | 117/102 |
| 6,024,826 A * | 2/2000 | Collins et al. | 156/345.37 |
| 6,055,927 A * | 5/2000 | Shang et al. | 118/723 ME |
| 6,059,922 A * | 5/2000 | Yamazaki et al. | 156/345.37 |
| 6,147,334 A * | 11/2000 | Hannigan | 219/544 |
| 6,171,438 B1 * | 1/2001 | Masuda et al. | 156/345.27 |
| 6,209,480 B1 * | 4/2001 | Moslehi | 118/723 I |
| 6,246,031 B1 * | 6/2001 | Yoo | 219/390 |
| 6,387,182 B1 * | 5/2002 | Horie et al. | 118/244 |
| 6,453,992 B1 * | 9/2002 | Kim | 165/206 |
| 6,468,601 B1 * | 10/2002 | Shang et al. | 427/563 |
| 6,729,261 B2 * | 5/2004 | Hongo | 118/723 MW |
| 6,740,853 B1 * | 5/2004 | Johnson et al. | 219/444.1 |
| 6,759,633 B2 * | 7/2004 | Kubodera et al. | 219/390 |
| 6,815,365 B2 * | 11/2004 | Masuda et al. | 438/710 |
| RE39,020 E * | 3/2006 | Hama et al. | 156/345.48 |
| 7,208,422 B2 * | 4/2007 | Kanai et al. | 438/715 |
| 7,255,774 B2 * | 8/2007 | Vukovic et al. | 156/345.48 |
| 7,347,901 B2 * | 3/2008 | Fink et al. | 118/724 |
| 7,565,879 B2 * | 7/2009 | Kanai et al. | 118/723 MW |
| 7,677,199 B2 * | 3/2010 | Cho et al. | 118/723 E |
| 7,886,687 B2 * | 2/2011 | Lee et al. | 118/723 E |
| 7,892,611 B2 * | 2/2011 | Swallow et al. | 427/569 |
| 8,030,599 B2 * | 10/2011 | Shimada | 219/390 |
| 8,034,181 B2 * | 10/2011 | Tandou et al. | 118/724 |
| 8,071,916 B2 * | 12/2011 | Iwata et al. | 219/385 |
| 8,092,602 B2 * | 1/2012 | Fink et al. | 118/724 |
| 8,133,323 B2 * | 3/2012 | Kakegawa | 118/724 |
| 8,318,358 B2 * | 11/2012 | Nelson et al. | 429/231.95 |
| 8,494,017 B2 * | 7/2013 | Sharma et al. | 372/44.011 |
| 8,519,309 B2 * | 8/2013 | Iwata et al. | 219/444.1 |
| 8,608,852 B2 * | 12/2013 | Mahadeswaraswamy et al. | 118/715 |
| 8,673,080 B2 * | 3/2014 | Meinhold et al. | 118/724 |
| 2001/0047760 A1 * | 12/2001 | Moslehi | 118/723 I |
| 2002/0007795 A1 * | 1/2002 | Bailey et al. | 118/723 R |
| 2004/0163601 A1 * | 8/2004 | Kadotani et al. | 118/728 |
| 2004/0250768 A1 * | 12/2004 | Kikuchi et al. | 118/715 |
| 2005/0016455 A1 * | 1/2005 | Cho et al. | 118/723 E |
| 2005/0045104 A1 | 3/2005 | Arai et al. | |
| 2005/0064717 A1 * | 3/2005 | Kanai et al. | 438/709 |
| 2005/0235915 A1 * | 10/2005 | Ho et al. | 118/723 E |
| 2006/0021574 A1 * | 2/2006 | Armour et al. | 118/715 |
| 2006/0137820 A1 * | 6/2006 | Lee et al. | 156/345.37 |
| 2006/0196424 A1 * | 9/2006 | Swallow et al. | 118/723 E |
| 2007/0039942 A1 * | 2/2007 | Leung et al. | 219/443.1 |
| 2008/0023448 A1 | 1/2008 | Tandou et al. | |
| 2011/0006039 A1 * | 1/2011 | Swallow et al. | 216/67 |
| 2011/0303641 A1 * | 12/2011 | Mahadeswaraswamy et al. | 216/67 |
| 2012/0118505 A1 * | 5/2012 | Ishibashi | 156/345.37 |
| 2012/0244684 A1 * | 9/2012 | Suzuki et al. | 438/478 |
| 2013/0065403 A1 * | 3/2013 | Paranjpe et al. | 438/758 |
| 2013/0126476 A1 * | 5/2013 | Marakhtanov et al. | 216/67 |
| 2013/0171746 A1 * | 7/2013 | Chang et al. | 438/7 |
| 2013/0180660 A1 * | 7/2013 | Nozawa et al. | 156/345.24 |

FOREIGN PATENT DOCUMENTS

| | | |
|---|---|---|
| JP | 2002-180253 A | 6/2002 |
| JP | 2003-077895 A | 3/2003 |
| JP | 2005-129483 A | 5/2005 |
| JP | 2008-034409 A | 2/2008 |
| TW | 399396 | 7/2000 |

OTHER PUBLICATIONS

International Search Report, PCT/JP2009/061952, Date of mailing; Aug. 11, 2009, issued by ISA/JP.

* cited by examiner

TEMPERATURE ADJUSTING MECHANISM AND SEMICONDUCTOR MANUFACTURING APPARATUS USING TEMPERATURE ADJUSTING MECHANISM

This application is a national phase application under 35 U.S.C. §371 of International Application Serial No. PCT/JP2009/061952, filed on Jun. 30, 2009, and claims the priority benefit under 35 U.S.C. §119 of Japanese Patent Application No. 2008-175590, filed on Jul. 4, 2008, which are hereby expressly incorporated by reference in their entirety for all purposes.

TECHNICAL FIELD

The present invention relates to a temperature adjusting mechanism and a semiconductor manufacturing device using the temperature adjusting mechanism. Particularly, the semiconductor manufacturing device includes the one relating to plasma treatment.

BACKGROUND OF ART

Advances in semiconductor industry require development of large size wafers and advanced, complex and high integration of integrated circuits (IC). In semiconductor manufacturing devices, stabilization of quality is required for achieving better cost advantage, and as one such challenge can be enumerated the improvement of uniformity in a wafer surface.

Plasma technology is widely used in the manufacture of many semiconductor devices such as integrated circuits, liquid crystals, solar cells, etc. Although plasma technology is used in semiconductor manufacturing processes for thin-film deposition and etching process, more advanced plasma processing techniques such as ultrafine processing technologies are required for more efficient and highly functional products. In particular, microwave plasma processing devices capable of generating stable and high density plasma even under relatively low pressure high vacuum conditions are often used. However, in plasma processing devices, since dielectric windows, etc. that propagate microwaves assume high temperatures relatively easily, controlling of temperature is necessary for generating stable plasma.

In patent document 1, optimization of cooling efficacy of a shower plate simultaneously with optimization of microwave excitation efficiency is described in microwave plasma processing devices that use radial slot line antenna. A cover plate forming part of an exterior wall of a processing chamber and joined to the shower plate is joined to a radiating surface of the radial line slot antenna. In addition, a cooler is installed on the radial line slot antenna for absorbing a heat flow flowing in a thickness direction through the exterior wall of the processing chamber.

In patent document 2 a temperature raising/lowering device for a semiconductor device that is small, thin and which responds quickly and precisely to a set temperature is described, wherein a uniform heating plate meant for uniform heating and cooling of the semiconductor wafer is cooled by providing a Peltier element in the heat transfer device. By making the heat transfer device in the form of a heat piping or heat lane, it is possible to transfer the heat more efficiently and achieve uniform heating.

In patent document 3 is described a fine pore tunnel type heat pipe with excellent heat transfer capability. As for the principle of heat transport, the heat transport due to sensible heat of a working liquid (heat transport due to vibration and/or circulation of the working liquid), and the heat transport due to the latent heat of the working liquid (heat transport due to evaporation and condensation in moving vapor of the working liquid) are used.

PRIOR ART DOCUMENTS

Patent Documents

Patent document 1: Japanese Patent Application Publication 2002-299330

Patent document 2: Japanese Patent Application Publication 2004-134475

Patent document 3: Japanese Patent Application Publication 2005-337691

SUMMARY OF THE INVENTION

Problems to be Solved by the Invention

The principle of heat transport using a two-phase condensable working liquid using the sensible heat of a working liquid (heat transport due to vibration and/or circulation of the operating fluid), and the heat transport due to the latent heat of the working liquid (heat transport due to evaporation and condensation in moving vapor of the working liquid) described in patent document 3 is well known.

The temperature raising/lowering device of a semiconductor device indicated in patent document 2 intends the set temperature be mainly in the vicinity of room temperature, and there is no mention of use under high temperature conditions as in plasma processing devices, etc.

In the plasma processing device of patent document 1, a method of cooling by using a heating medium around the dielectric window (for example upper part of the device) was used for controlling excess heat of the dielectric window (or the shower plate). However, in this method, a temperature differential in the heating medium occurred near the inlet and outlet of the circulation path. In particular, the temperature differential tended to be larger with an increase in the area of the object to be cooled. Although the responsiveness of cooling or cooling capacity could be improved by forming dense or long flow paths for circulation, still there was a limitation for temperature control.

In addition, based on the experiments, etc. of the inventors, it was found that factors affecting the plasma processing characteristics of the plasma processing equipment were not limited to the overheating of the plate member such as dielectric window or shower plate, etc. It was found that controlling of the temperature distribution of these plate members more precisely was critical for improving the processing characteristics of the devices.

The present invention, made in view of the situation above, has the objective to provide a temperature adjusting mechanism that can minimize the temperature deviation in the section in contact with the temperature adjusting mechanism by controlling the temperature precisely and quickly, and a semiconductor manufacturing device using the temperature adjusting mechanism.

Means of Solving the Problems

To achieve the above objective, a temperature adjusting mechanism according to a first aspect of the present invention is:

A temperature adjusting mechanism which is in contact with a member surrounding a space housing a processing object in a processing container, the temperature adjusting mechanism including:

an annular narrow tube positioned along a direction of an exterior surface of the space housing the processing object; and a two-phase condensable working liquid of vapor and liquid sealed in the annular narrow tube.

Preferably, the annular narrow tube is installed by meandering, and a heat exchanger is provided so as to be in contact with at least part of the annular narrow tube.

Preferably, a minimum distance between the heat exchanger and the space housing the processing object is more than a distance between the annular narrow tube and the space housing the processing object at least in a range of the minimum distance of the heat exchanger.

Preferably, each of plurally-divided sections of the temperature adjusting mechanism which is in contact with the member surrounding the space housing the processing object is provided with the annular narrow tube independently.

Preferably, the temperature in each of the plurally-divided sections of the temperature adjusting mechanism can be adjusted to an independently predetermined temperature.

Preferably, each of the plurally-divided sections of the temperature adjusting mechanism is provided with the heat exchanger contacting the annular narrow tube.

Preferably, the member is a plate shape member 6a that seals plasma in the processing container and is opposite to the processing object with the plasma therebetween.

Preferably, the annular narrow tube is provided at a side of a surface of the plate shape member facing the external side of the processing container.

Preferably, the annular narrow tube is arranged such that it meanders by folding in the space between a center and a periphery of the plate shape member, and the heat exchanger is provided in the proximity of the periphery of the plate shape member.

Preferably, the annular narrow tube is arranged to meander by crossing a line from a center to a periphery of the plate shape member, and the heat exchanger is provided along a direction from the center to the periphery of the plate shape member.

Preferably, the annular narrow tube in which the two-phase condensable working liquid of vapor and liquid is sealed is provided around an extended direction of a principal surface of the plate shape member.

Preferably, the member is a shower plate which is located in the space housing the processing object of the processing container and which introduces a gas used in a plasma treatment towards the processing object, and the shower plate are provided with the annular narrow tube inside the shower plate and a gas flow passage for the gas used in the plasma treatment.

A semiconductor manufacturing device according to a second aspect of the present invention includes the temperature adjusting mechanism according to the first aspect.

Effect of the Invention

According to the temperature adjusting mechanism of the present invention and the semiconductor manufacturing device using the temperature adjusting mechanism, the temperature deviation of the section contacting the temperature control mechanism can be minimized by precise and fast temperature control.

EMBODIMENTS OF THE INVENTION

First Embodiment

Figure 1:
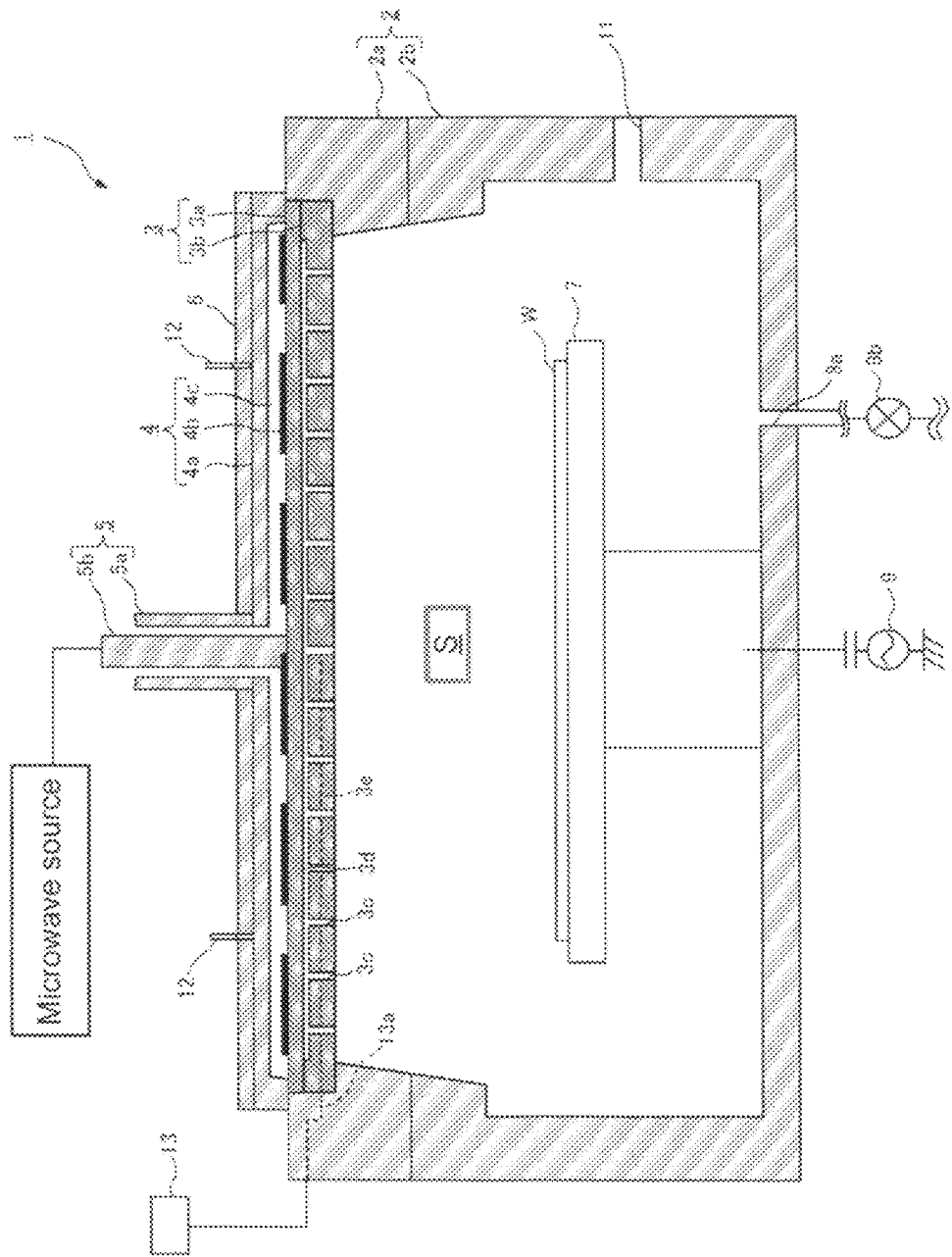
FIG. 1 is a schematic configuration diagram showing the plasma processing device which is the semiconductor manufacturing device according to the embodiment of the present invention.
Figure 2:
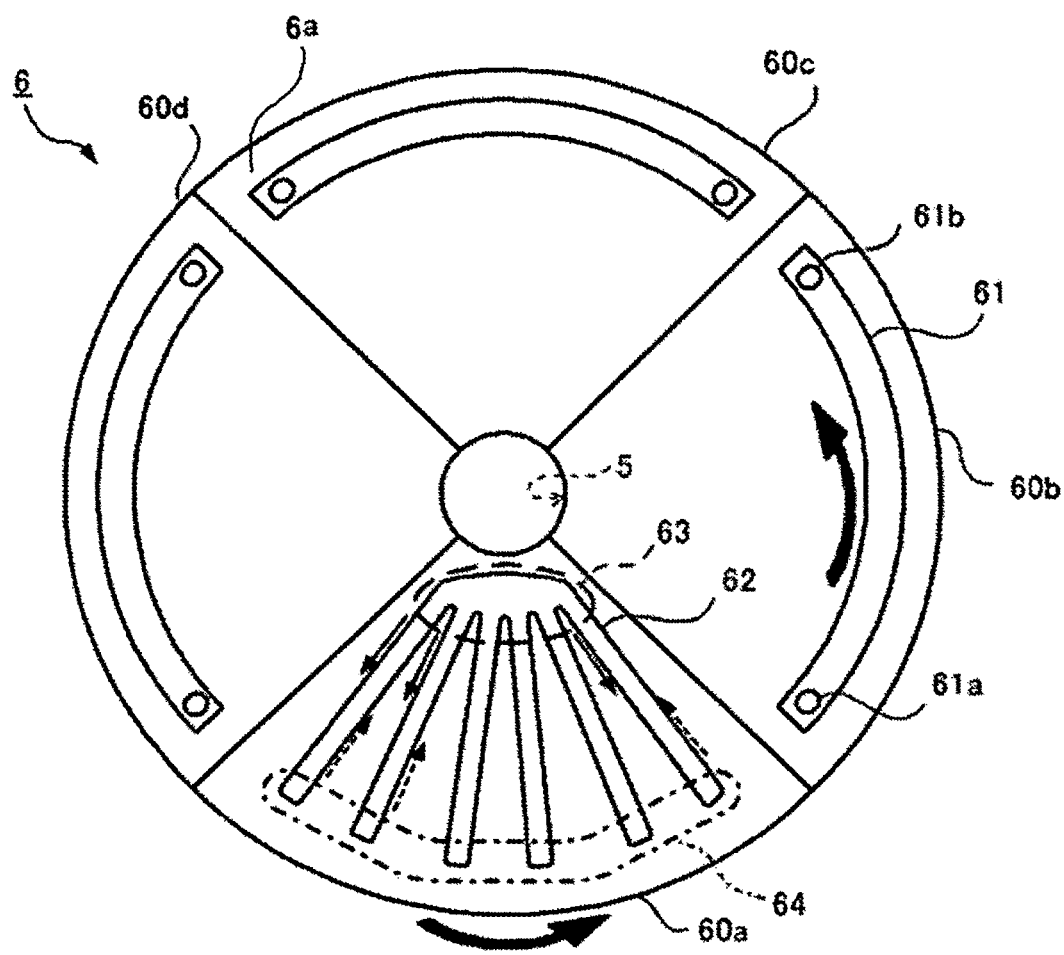
FIG. 2 is a configuration diagram of the cooling jacket which is the temperature adjusting mechanism according to the first embodiment of the present invention.

The embodiments are explained below in detail referring to drawings. Further, the same number is assigned for identical or corresponding sections in the drawings. FIG. 1 is a schematic configuration diagram of a plasma processing device which is a semiconductor manufacturing device according to the embodiment of the present invention. FIG. 2 is a configuration diagram of a cooling jacket which is a temperature adjusting mechanism according to the first embodiment of the present invention. For sake of explanation, only the situation within a section (section 60a only) of the cooling jacket is shown in FIG. 2.

The plasma processing device 1 is provided with a processing container (chamber) 2, a dielectric window 3, an antenna 4, a waveguide 5, a cooling jacket 6, a substrate holder 7, an exhaust port 8a, a vacuum pump 8b, a high frequency power source 9, a temperature sensor 12, and a gas source 13. The processing container 2 is provided with the exhaust port 8a and the vacuum pump 8b, and the inside of the processing container 2 where an upper opening is sealed can be maintained at a predetermined pressure.

A retainer ring 2a is provided at an upper part of a lower container 2b constituting part of a wall of the processing container 2. The retainer ring 2a is formed such that the concentric circles expanding towards the ceiling of the processing container 2 have different diameter (inner diameter) of the ring, and while holding the dielectric window 3 so as to cover the side surface of the dielectric window 3, locks a surface of the dielectric window 3 facing the processing container 2. The retainer ring 2a and the lower container 2b are made from for example aluminum (Al), etc., and their inner wall surface is provided with a protective film made of aluminum oxide, etc., by oxidation treatment, for example.

The dielectric window 3 is made of dielectric materials such as $SiO_2$ or $Al_2O_3$, etc. that propagate the microwaves, and by securing the periphery to the retainer ring 2a, the opening of the processing container 2 can be closed. The dielectric window 3 is provided with an upper plate 3a and a shower plate 3b. The shower plate 3b is provided with a plurality of nozzle openings 3c, a concave groove 3d, and a flow passage 3e connecting to the opening, and are connected by attaching the shower plate 3a. The flow passage connected thus functions as a flow passage for plasma gas, and the gas introduced into the dielectric window 3 from the gas source 13 is supplied uniformly into the space S just below the dielectric window 3.

The antenna 4 is composed of a waveguide part 4a, a radial line slot antenna (RLSA) 4b and a slow-wave plate 4c. The slow-wave plate 4c is located between the waveguide part 4a and the radial line slot antenna 4b, and narrows the wavelength of the microwave. The waveguide 4b is composed of a shield member to integrate with the cooling jacket 6, and the slow-wave plate 4c is composed of dielectric materials such as $SiO_2$ and $Al_2O_3$, etc. The waveguide 5 is a coaxial waveguide and comprised of an exterior waveguide 5a and an interior waveguide 5b.

The antenna 4 is joined atop the dielectric window 3. More specifically, the radial line slot antenna 4b of the antenna 4 is closely fixed to the upper plate 3a of the dielectric window 3. The waveguide 5 is connected to the antenna 4. The waveguide part 4a is connected to the exterior waveguide 5a, and the radial line slot antenna 4b is joined to the interior waveguide 5b.

The cooling jacket 6 which assists in controlling the temperature of the dielectric window 3 is provided on the antenna 4. By forming the cooling jacket 6 such that it becomes a single body with the waveguide part 4a of the antenna 4, the heat transfer can be accomplished with better efficiency. A surface of the cooling jacket 6 facing the dielectric window 3 is divided into 4 fan-shaped sections of identical shape and identical area (the divided fan-shaped sections 60a, 60b, 60c, and 60d of the cooling jacket 6). Further, a required number of temperature sensors 12 are provided near the antenna 4, or in the periphery of the waveguide 5. The temperature sensors 12 detect the temperature of such as antenna 4 and for example are comprised of fiber sensors, etc.

The cooling jacket 6 is provided with a cooling channel 61 and a heat lane 62. The cooling channel 61 is provided in the periphery of the cooling jacket, and the heat lane 62 is provided by meandering between the center and the periphery of the cooling jacket 6.

The cooling channel 61, by circulating a heat medium inside the cooling channel 61, cools the cooling jacket 6. The thick arrow in the drawing indicates the direction of flow of the heat medium flowing through the cooling channel 61. For example, in accordance with a desired temperature of an upper part of the dielectric window 3 to be cooled, the temperature of the chiller (not illustrated) is set beforehand, and the heat medium of required temperature is supplied from the chiller. By cooling the cooling jacket 6 by removing the heat with the heat medium, the dielectric window 3 facing the cooling jacket 6 can be cooled. The heat medium is supplied from the chiller, enters through a flow passage inlet 61a, exits from a flow passage outlet 61b via the cooling channel 61, and is returned again to the chiller. As the heat medium used in cooling, for example can be employed liquid heat exchange media such as silicone oil, fluorinated liquids, or ethylene glycol.

The heat lane 62 is constituted by providing a heat receiving section (vaporizer) 63 and a heat dissipating section (condenser) 64, and sealing a two-phase condensable working liquid (hereinafter referred to as working liquid) inside an annular narrow tube that alternately folds back and forth several times in the space between the heat receiving section 63 and the heat dissipating section 64. Annular refers to forming of the tube into a shape without interruption, and indicates the circulation of the sealed liquid inside the heat lane 62 without interruption. In this, the working liquid in the heat lane 62 is sealed at a pressure at which the working liquid undergoes a phase transition from the liquid phase to the vapor phase in the intended temperature range.

The heat dissipating section 64 is a section cooled by the cooling channel 61 at the periphery of the cooling jacket 6, and shows the area enclosed by the dot-dashed line in the drawing. The heat receiving section 63 is located in a place away from the heat dissipating section 64, in this case near to the middle of the cooling jacket 6, and shows the area enclosed by the dotted line in the drawing. As a heat exchanger provided at the heat lane 62 is the cooling channel 61 for carrying out cooling, a given section of the heat exchanger was made into the heat dissipating section 64. However, if the heat exchanger is of a heating type, a given section of the heat exchanger becomes the heat receiving section 63. In the drawing, to facilitate easy understanding, the heat receiving section 63 and the heat dissipating section 64 are indicated by enclosing by line. In reality, the section of the heat lane 62 that is cooled and is at a lower temperature functions as the heat dissipating section 64, and the section that is at a relatively higher temperature than the heat dissipating section 64 functions s the heat receiving section 63.

In the heat receiving section 63, the working liquid absorbs heat and undergoes nucleate boiling, the working liquid self-excites, and transfers the sensible heat while circulating. The thin arrow in the drawing indicates the state of circulation of the working liquid, and the solid line arrow shows the transfer from heat receiving section 63 to the heat dissipating section 64, and the dotted line arrow shows the transfer from the heat dissipating section 64 to the heat receiving section 63. Further, the working liquid absorbs heat and undergoes phase transition from liquid phase to vapor phase in the heat receiving section 63, and undergoes cooling by releasing heat resulting in a phase transition from vapor phase to liquid phase due to condensation of vapor phase in the heat dissipating section 64, and due to these phase transitions of vapor and liquid, transfers the latent heat. In this manner, a transfer of heat takes place between the heat receiving section 63 and the heat dissipating section 64 in the heat lane 62 due to sensible heat transfer and latent heat transfer. Moreover, in the heat lane 62, since heat transfer always occurs not only between the heat receiving section 63 and the heat dissipating section 64 but also wherever temperature difference exists, the temperature difference becomes small and it becomes possible to achieve uniform temperature in a short time.

The heat lane 62 is configured such that the heat lane 62 meanders inside the cooling jacket 6 by folding between the middle and periphery of the dielectric window 3, and in any section, the distance from the heat receiving section 63 to the heat dissipating section 64 becomes equal. As a result, since the temperature distribution at the middle and the periphery of cooling jacket 6 becomes equal, and the temperature distribution becomes equal in the entire radial direction, it becomes possible to maintain a uniform temperature distribution in the cooling jacket 6.

Since, in the cooling jacket 6, the temperature near the waveguide 5 is the highest during plasma formation, and the temperature decreases towards the periphery, the heat receiving section 63 of the heat lane 62 is placed in the high temperature section. Although heat transport occurs such that the temperature between the heat receiving section 63 and the heat dissipating section 64 becomes uniform by the heat line 62, at the same time, the heat received in the heat receiving section 63 continues to get accumulated in the heat dissipating section 64. By taking away the heat stored in the heat dissipating section 64 with the cooling channel 61 provided to the cooling jacket 6, it is possible to prevent heat accumulation in the heat lane 62. Furthermore, by making the quantum of heat taken away by the cooling channel 61 larger than the quantum of the accumulated heat, it becomes possible to cool the cooling jacket 6. Thus, it is possible to achieve in-plane uniform temperature distribution in a short time within the cooling jacket 6 provided with the heat lane 62 while carrying out cooling at a predetermined temperature.

The surface of the cooling jacket 6 facing the dielectric window 3 is further divided into 4 fan-shaped sections of identical shape and identical area. Temperature adjustment is possible for each of these divided fan-shaped sections 60a, 60b, 60c, and 60d (hereafter referred to as section 60n). By matching with the temperature of the antenna 4 detected with the multiple temperature sensors 12, controlling the cooling channel 61 provided in the section 60n, and circulating the heat medium set at a predetermined temperature, the section 60n of the cooling jacket 6 can be cooled to a desired temperature. The temperature adjustment of the heat medium is done for example with a cooling facility provided in the chiller, and the heat medium is supplied at a predetermined temperature to the cooling channel 61 from the flow passage inlet 61a. Each section 60n of the cooling jacket 6 can be controlled at a predetermined temperature, and uniform temperature distribution in that section 60n can be achieved with the heat lane 62.

A method of plasma processing is briefly explained below. The processing container 2 of the plasma processing device 1 is sealed by the dielectric window 3. During this process, the inside of the processing container 2 is made into vacuum state by evacuating and reducing pressure with the exhaust port 8a and the vacuum pump 8b.

Microwave is supplied from the microwave source via the waveguide 5. The microwave is radially transmitted between the wave guide section 4a and the radial line slot antenna 4b, and is radiated through the slot of the radial line slot antenna 4b.

When generating plasma by charging the microwave into the processing container 2, an inert gas such as argon (Ar) or xenon (Xe), and nitrogen ($N_2$), etc., and if required a process gas such as hydrogen, etc., are supplied to the gas flow passage from the gas source 13. The gas is radiated uniformly toward just below the dielectric window 3, and introduced into the processing container 2. Voltage is applied to the high-frequency power source 9, and by inducing the argon (Ar) or xenon (Xe) plasma generated in the space S, the processing substrate W kept on the substrate holder 7 can be subjected to plasma treatment. For example, so-called CVD (Chemical Vapor Deposition) is carried out for forming a film such as an insulating film on the processing substrate W. By repeating a series of operations like bringing in the processing substrate W and transporting after plasma treatment, a predetermined substrate processing is carried out for a predetermined number of substrates.

Since the vicinity of the dielectric window 3 becomes hot because of the heat generated in the formation of the plasma and heat accumulates in the dielectric window 3 itself, a temperature distribution is easily produced. The dielectric window 3 can be cooled with the cooling channel 61 provided to the cooling jacket 6. The cooling jacket 6 can be located on the antenna 4 near the heat generating section in the plasma processing device 1, and by absorbing the heat accumulated in the dielectric window 3 via the radial line slot antenna 4b, carry out the cooling efficiently, and there would be hardly any effect of heat on other parts inside the device.

Even in the middle and the periphery of the dielectric window 3 located near the waveguide 5, a temperature distribution can easily be produced. The temperature difference between the middle and the periphery of the cooling jacket 6 can be resolved within a short time with the help of the heat lane 62. Moreover, since the heat lane 62 is provided with same length in any radial direction, it is possible to achieve uniform temperature distribution in the plane of the cooling jacket 6. Therefore, it possible to maintain the dielectric window 3 facing the cooling jacket 6 at required temperature within a short duration, and achieve a uniform temperature distribution, thereby a stable plasma can be formed.

Further, when carrying out plasma treatment of the processing substrate, it becomes possible to form more stable plasma by performing a temperature adjustment matching the plasma mode. It is possible to control the temperature of the heat medium flowing in the cooling channel 61 of the section 60n which was created by dividing the surface of the cooling jacket 6 facing the dielectric window 3. By cooling each of the sections 60n to a predetermined temperature and achieving uniform temperature distribution inside the section 60n with the help of the heat lane 62, it becomes possible to maintain preferable conditions for plasma formation.

Modified Example of First Embodiment

Figure 3:
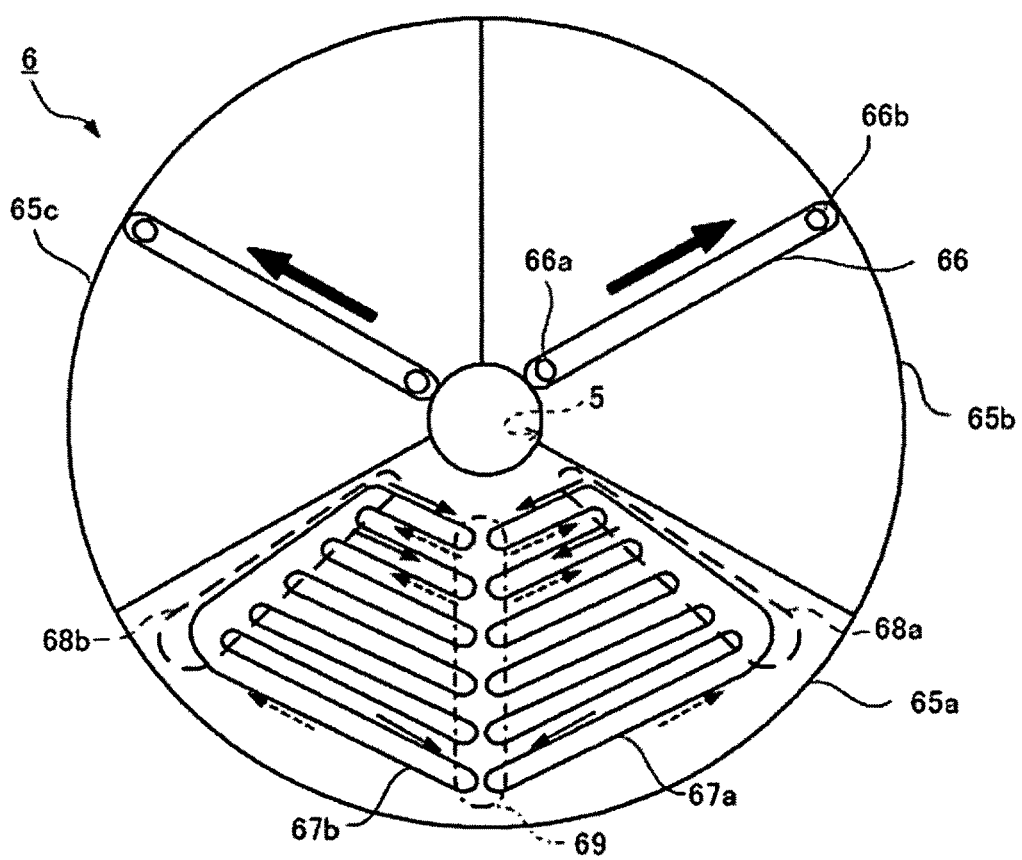
FIG. 3 is a configuration diagram showing a modified example of the cooling jacket according to the first embodiment of the present invention.

FIG. 3 is a configuration diagram of the cooling jacket which is the temperature adjusting mechanism according to the first embodiment of the present invention. For sake of explanation, the inner condition of one part (a section 65a only) of the cooling jacket is shown in FIG. 3. The semiconductor manufacturing device provided with the cooling jacket 6 employs the plasma processing device 1 shown in FIG. 1, and except for the configuration of the cooling jacket 6, it is as shown in the first embodiment.

The surface of the cooling jacket 6 facing the dielectric window 3 is divided into 3 fan-shaped sections of identical shape and identical area (the divided fan-shaped sections 65a, 65b, and 65c of the cooling jacket 6). In FIG. 3, for sake of explanation, the inner condition of only the section 65a is shown.

Each divided section of the cooling jacket 6 is provided with a cooling channel 66, and heat lanes 67a and 67b. The cooling channel 66 is provided on the line joining the center and the periphery so as to cut the divided section 65a from the middle. The heat lanes 67a and 67b are provided so as to sandwich the cooling channel 66 and assume a mirror symmetry. Below, since the heat lane 67a and the heat lane 67b have a mirror symmetry relationship and function, etc. are the same, a description of the heat lane 67b is omitted. The heat lane 67a is formed as one continuous toroid inside the divided section 65a such that the diameter of an arc, along the arc of the fan-shaped section, is larger than the preceding arc every time it folds. The heat lane 67a is not limited to curve along the arc, and it may also be formed as a straight line to intersect the line from the center to the periphery, and formed to be dense inside the divided section 65a.

The cooling jacket 6 can be cooled by circulating a heat medium inside the cooling channel 66. The thick arrow in the drawing indicates the direction of flow of the heat medium flowing through the cooling channel 66. By supplying the heat medium from a flow passage inlet 66a near the waveguide 5 which easily becomes hot into the cooling channel 66, and discharging the heat medium through the flow passage outlet 66b near the dielectric window 3 periphery which is at a relatively lower temperature, the vicinity of the dielectric window 3 can be efficiently cooled. By setting the temperature of the chiller beforehand, and circulating the heat medium through the cooling channel 66 with chiller as the starting point and end point for the heat medium, the dielectric window 3 can be cooled to a predetermined temperature. As a heat medium used for cooling, for example can be employed liquid heat exchange media such as silicone oil, fluorinated liquids, or ethylene glycol.

The heat lane 67a is composed by providing a heat receiving section (vaporizer) 68a and a heat dissipating section (condenser) 69, and sealing a two-phase condensable working liquid (hereafter referred to as working liquid) inside an annular narrow tube that alternately folds back and forth several times in the space between the heat receiving section 68a and the heat dissipating section 69. Annular refers to forming of the tube into a shape without interruption, and indicates the circulation of the sealed heat medium inside the heat lane 67a without interruption. In this, the working liquid in the heat lane 67a is sealed at a pressure at which the working liquid undergoes a phase transition from the liquid phase to the vapor phase in the intended temperature range.

The heat dissipating section 69 is a section cooled by the cooling channel 66 provided on the line going from the center of the cooling jacket 6 towards the periphery, and shows the section enclosed by a dot-dashed line in the drawing. The heat receiving section 68a is located in a place away from the heat dissipating section 69, and in this case set at one edge of the fan shape of the divided section 65a of the cooling jacket 6, and shows the section enclosed by the dotted line in the drawing. As a heat exchanger provided in the heat lane 67a is the cooling channel 66 for carrying out cooling, a given section of the heat exchanger was made into the heat dissipating section 69. However, if the heat exchanger is of a heating type, a given section of the heat exchanger becomes the heat receiving section 68a. In the drawing, to facilitate easy understanding, the heat receiving section 68a and the heat dissipating section 69 are indicated by enclosing by line. In reality, the section of the heat lane 67a that is cooled and is at a lower temperature functions as the heat dissipating section 69, and the section that is at a relatively higher temperature than the heat dissipating section 69 functions as the heat receiving section 68a.

In the heat receiving section 68a, the working liquid absorbs heat and undergoes nucleate boiling, the working liquid self-excites, and transfers the sensible heat while circulating. The thin arrow in the drawing indicates the state of circulation of the working liquid, and the solid line arrow shows the transfer from heat receiving section 68a to the heat dissipating section 69, and the dotted line arrow shows the transfer from the heat dissipating section 69 to the heat receiving section 68a. Further, the working liquid absorbs heat and undergoes phase transition from liquid phase to vapor phase in the heat receiving section 68a, and undergoes cooling by releasing heat resulting in a phase transition from vapor phase to liquid phase due to condensation of vapor phase in the heat dissipating section 69, and due to these phase transitions of vapor and liquid, transfers latent heat. In this manner, a transfer of heat takes place between the heat receiving section 68a and the heat dissipating section 69 in the heat lane 67a due to sensible heat transfer and latent heat transfer. Moreover, in the heat lane 67a, since heat transfer normally occurs not only between the heat receiving section 68a and the heat dissipating section 69 but also wherever a temperature difference exists, the temperature difference becomes small and it becomes possible to achieve uniform temperature in a short time.

Further, although the heat received by the heat receiving section 68a is carried to the heat dissipating section 69 by heat transport and the heat continues to accumulate in the heat dissipating section 69, this accumulated heat can be removed by using the heat medium of the cooling channel 66 resulting in the cooling of the cooling jacket 6. Thus, it is possible to achieve in-plane uniform temperature distribution in a short time within the cooling jacket 6 provided with the heat lane 67a while carrying out cooling at a predetermined temperature.

The surface of the cooling jacket 6 facing the dielectric window 3 is further divided into 3 fan-shaped sections of identical shape and identical area. Individual temperature adjustment for each of the divided fan-shaped sections 65a, 65b and 65c is also possible. By circulating a heat medium set at a predetermined temperature through the cooling channel 66 provided in the sections 65a, 65b and 65c, it is possible to cool each divided section to a desired temperature. The temperature adjustment of the heat medium is done with a chiller, and the heat medium is supplied at a predetermined temperature to the cooling channel 66 from the flow passage inlet 66a. Each of the sections 65a, 65b and 65c can be controlled, within a short duration, to a predetermined temperature by the cooling jacket 6, and uniform temperature distribution in that section can be achieved with the heat lane 67.

Second Embodiment

Figure 4A:
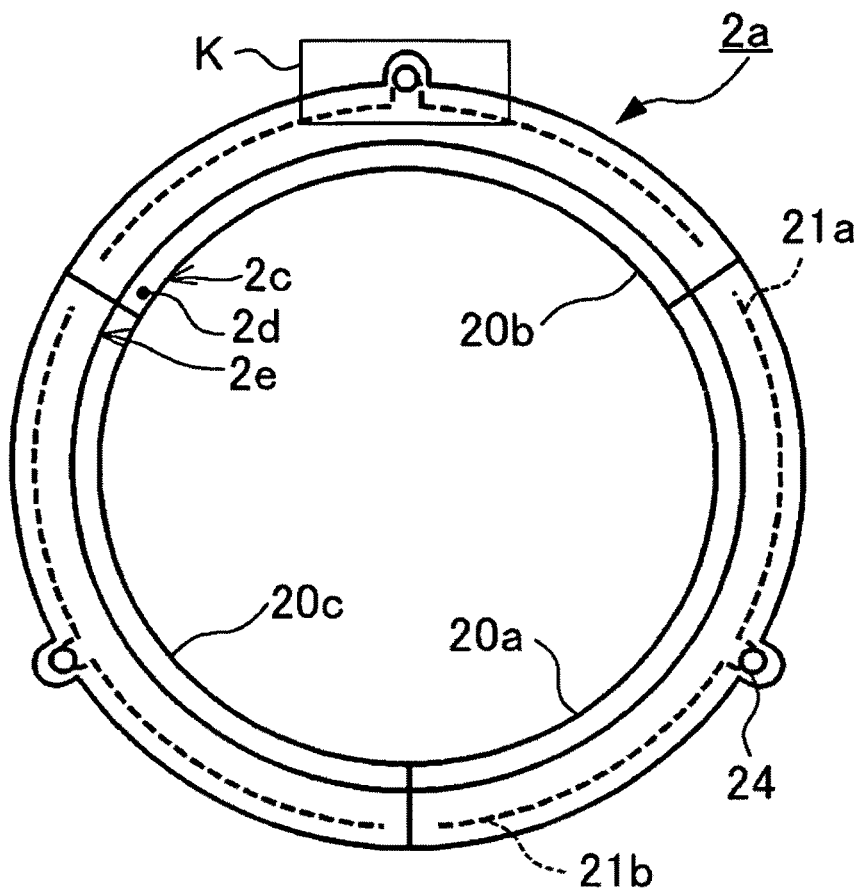
FIG. 4A is a figure showing the configuration of the retainer ring which is the temperature adjusting mechanism according to the second embodiment of the present invention, and is a plane view of the retainer ring as viewed from the dielectric window side.
Figure 4B:
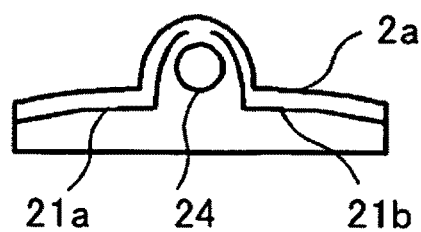
FIG. 4B is a figure showing the condition inside the enclosure K of FIG. 4A.
Figure 4C:
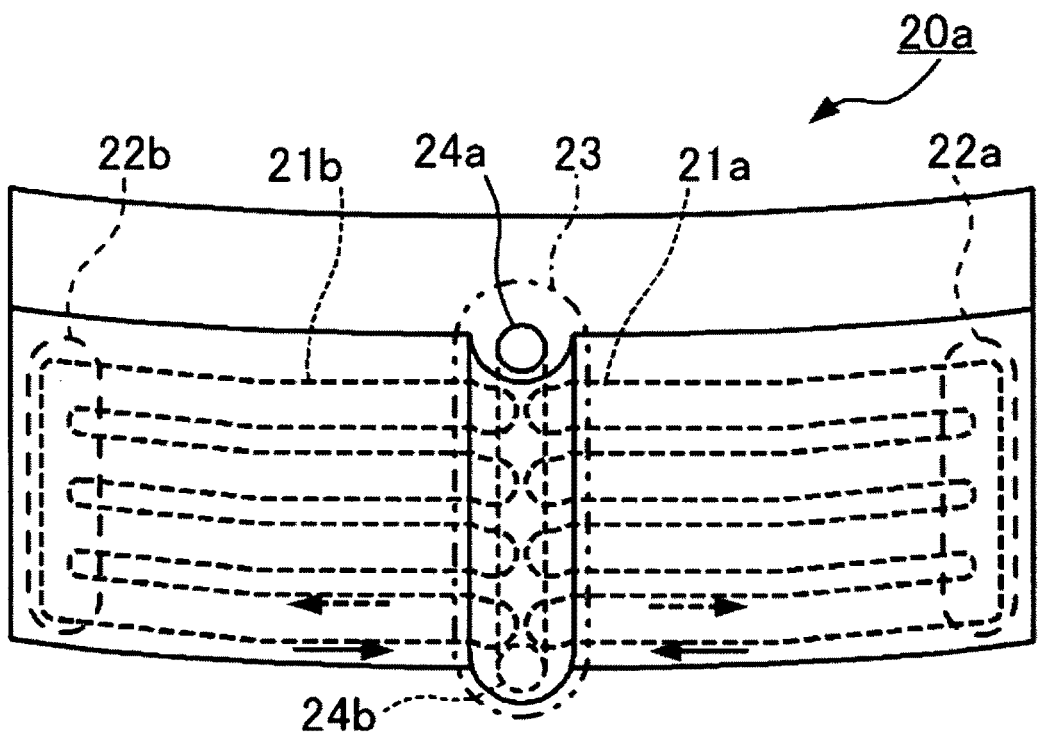
FIG. 4C is a perspective view of one section of the retainer ring which has been divided into a plurality of sections.

FIG. 4 is a configuration diagram of a retainer ring which is a temperature adjusting mechanism according to the second embodiment of present the invention. FIG. 4A is a plane view as viewed from the dielectric window 3 side, FIG. 4B is a figure showing the condition inside the enclosure K in FIG. 4A, and FIG. 4C is a perspective view of part of the retainer ring 2a (only a section 20a of the part divided into multiple sections). The semiconductor manufacturing device provided with the retainer ring 2a uses the plasma processing device 1 shown in FIG. 1, and the basic configuration is the same as in the first embodiment.

The retainer ring 2a locking the dielectric window 3 is provided with heat lanes 21a and 21b, and a cooling passage 24 to each of sections 20a, 20b and 20c that divide the circumference of the dielectric window 3 into three equal parts, and can cool the dielectric window 3 from the side. The heat lanes 21a and 21b are arranged symmetrically with the cooling channel 24 as the center. The cooling channel 24, by circulating the heat medium through it, performs the cooling by removing the heat from the retainer ring 2a. Concretely, the heat medium supplied from the chiller enters from a flow passage inlet 24a, is discharged from a flow passage outlet 24b via the cooling channel 24 provided in the retainer ring 2a, and is again returned to the chiller. When passing through the cooling channel 24, the heat of the retainer ring 2a is removed with the heat medium, and results in cooling. By setting the temperature of the chiller beforehand, the retainer ring 2a can be cooled to a predetermined temperature. As the heat medium used in cooling, for example can be employed liquid heat exchange media such as silicone oil, fluorinated liquids, or ethylene glycol.

The heat lane 21a is composed by providing a heat receiving section (vaporizer) 22a and a heat dissipating section (condenser) 23 to the divided section 20a, and sealing a two-phase condensable working liquid (hereafter referred to as working liquid) inside an annular narrow tube in the space between the heat receiving section 22a and the heat dissipating section 23 that alternately folds back and forth several times in the circumferential direction on the outer circumference of the dielectric window 3. The annular narrow tube refers to a narrow tube formed without interruption and a working liquid sealed at a predetermined pressure can be circulated in the heat lane 21a. The pressure when sealing the working liquid in the heat lane 21a shall be a pressure that can facilitate a phase transition of the working liquid from liquid phase to vapor phase within the target temperature range.

The heat dissipating section 23 is the section cooled by the cooling channel 24 of the retainer ring 2a, and is at one end of the section 20a, and shows the area enclosed by the dot-dashed line in the drawing. The heat receiving section 22a is located at the other end opposite to the heat dissipating section 23 of the section 20a, and shows the area enclosed by dotted line in the drawing. Each of the sections 20a, 20b and 20c of the retainer ring 2a is provided with the heat lanes 21a and 21b with left-right symmetry with the cooling channel 24 as the center. Common to the heat dissipating section 23, the heat receiving sections 22a and 22b are provided, at both ends, for each heat lane 21a and 21b. In the drawing, to facilitate easy understanding, the heat receiving section 22a and the heat dissipating section 23 are indicated by enclosing by a line. In reality, the section of the heat lane 21 that is cooled and is at a lower temperature functions as the heat dissipating section 23, and the section that is at a relatively higher temperature than the heat dissipating section 23 functions as the heat receiving section 22.

In the heat receiving section 22a, the working liquid absorbs heat and undergoes nucleate boiling, the working liquid self-excites, and transfers the sensible heat while circulating. The thin arrow in the drawing indicates the state of circulation of the working liquid, and the solid line arrow shows the transfer from the heat receiving section 22a to the heat dissipating section 23, and the dotted line arrow shows the transfer from the heat dissipating section 23 to the heat receiving section 22a. Further, the working liquid absorbs heat and undergoes phase transition from liquid phase to vapor phase in the heat receiving section 22a, and undergoes cooling by releasing heat resulting in a phase transition from vapor phase to liquid phase due to condensation of vapor phase in the heat dissipating section 23, and due to these phase transitions of vapor and liquid, the latent heat is transferred. Thus, heat lane 21a carries out the heat transfer between heat receiving section 22a and heat dissipating section 23 by sensible heat transfer and latent heat transfer. Moreover, in the heat lane 21, since heat transfer always occurs not only between the heat receiving section 22a and the heat dissipating section 23 but also wherever temperature difference exists, the temperature difference becomes small and it becomes possible to achieve uniform temperature in a short time.

At the same time, the heat received at the receiver 22a of the heat lane 21a is transported to the heat dissipating section 23, and the heat continues to accumulate in the heat dissipating section 23. The heat accumulated in the heat dissipating section is removed with the cooling channel 24 provided in the retainer ring 2a thereby preventing an increase of heat, and further, by removing a predetermined quantity of heat, it becomes possible to cool to a desired temperature.

Even in a case of the heat lane 21b, heat transport occurs similar to the heat lane 21a, the temperature distribution becomes uniform, and it becomes possible to cool the section provided with the heat lane 21b. Not only section 20a, but each of the sections 20b and 20c of the retainer ring 2a are also similar, and as a result, by providing the heat lane 21 and the cooling channel 24 to the retainer ring 2a, it becomes possible to cool the dielectric window 3 from the sides to a predetermined temperature, and maintain a uniform temperature distribution.

Moreover, the retainer ring 2a cools the heat generated by plasma conveyed to the lateral direction in the space S. The temperature differential produced in the retainer ring 2a during this is very small in the heat lanes 21a and 21b, that is the section in contact with the space S where the plasma is produced, and there is hardly any effect of temperature on the treatment process (such as conditions for generation of plasma, etc.). The temperature differential of the retainer ring 2a occurs mainly between the heat lanes 21a, 21b and the cooling channel 24, and occurs especially in the vicinity of the cooling channel 24 which is the heat dissipating section 23; however, by locating the cooling channel 24 in the section projecting outside from the retainer ring 2a, there will not be direct contact with the space S. Due to this, there is no effect of temperature in the space S where the treatment process is performed, and the inside surface of the retainer ring 2a can be maintained almost at a uniform temperature.

The retainer ring 2a is comprised of the sections 20a, 20b and 20c that are so formed as to divide the circumference of the dielectric window 3 into 3 equal parts, and each of those sections is provided with the heat lanes 21a, b and the cooling passage 24, and each cooling channel 24 is provided with the flow passage inlet 24a and the flow passage outlet 24b. By separately controlling the temperature of the heat medium with a chiller before it enters the flow passage inlet 24a, it is possible to change the temperature of cooling for each of the sections 20a, 20b and 20c. Although the temperature setting in each of the sections 20a, 20b and 20c is different, the temperature distributions in the surfaces that are cooled in each of those sections 20a, 20b and 20c become uniform by the heat lane 21 sections 20a and b. By making the temperature distribution uniform, and setting a predetermined temperature for each section, it becomes possible to maintain a more optimal temperature condition for sustaining the plasma mode.

Third Embodiment

Figure 5:
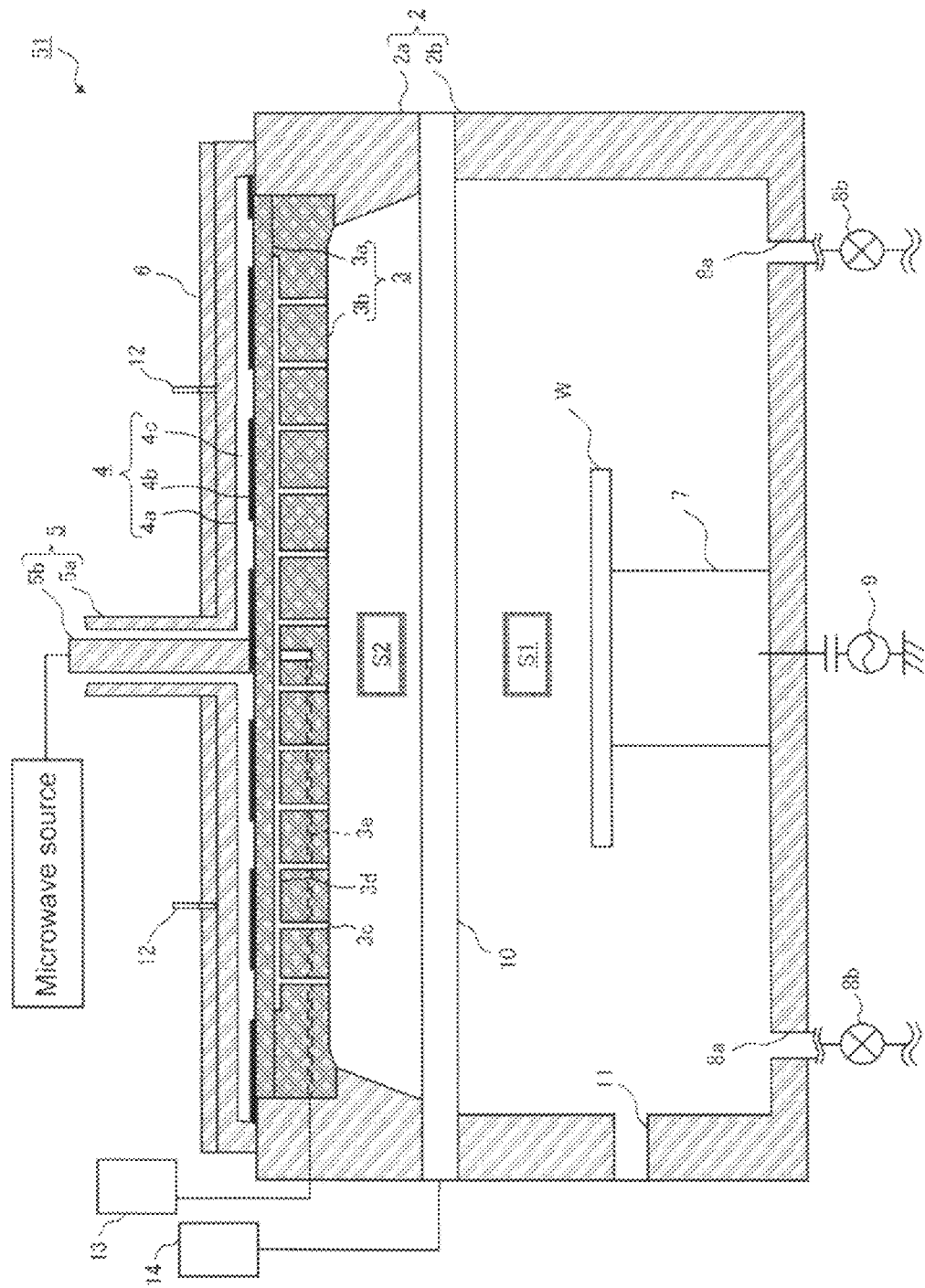
FIG. 5 is a schematic configuration diagram showing a modified example of the plasma processing device according to the third embodiment of the present invention.
Figure 6A:
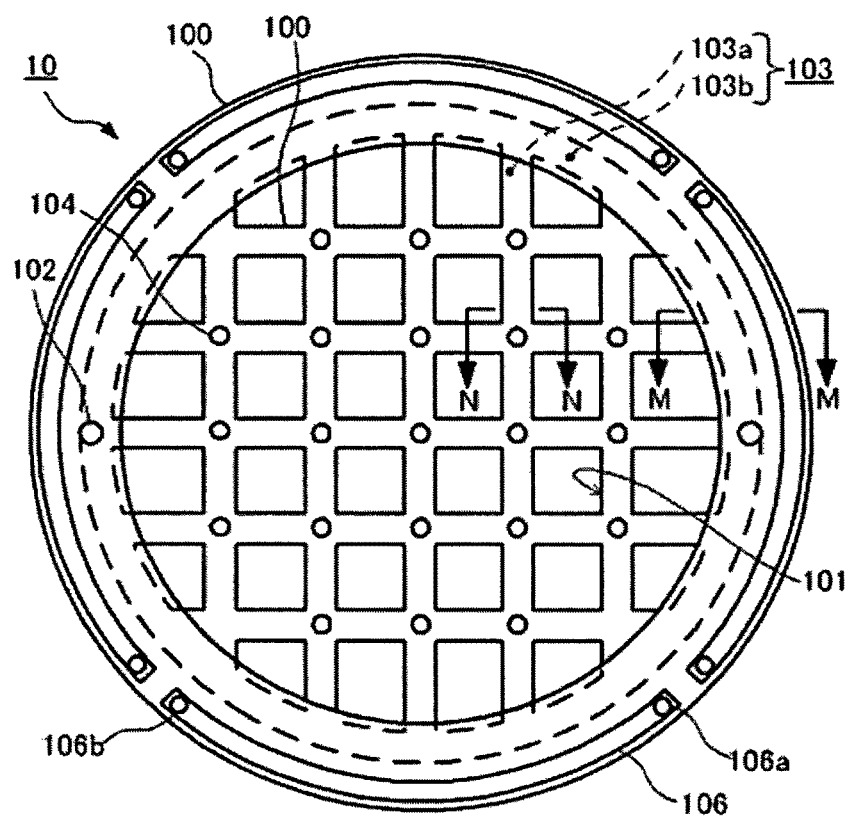
FIG. 6A is a figure showing a configuration of the lower shower plate which is the temperature adjusting mechanism according to the third embodiment of the present invention, and is a plane view of the lower shower plate as seen from the processing container side.
Figure 6B:
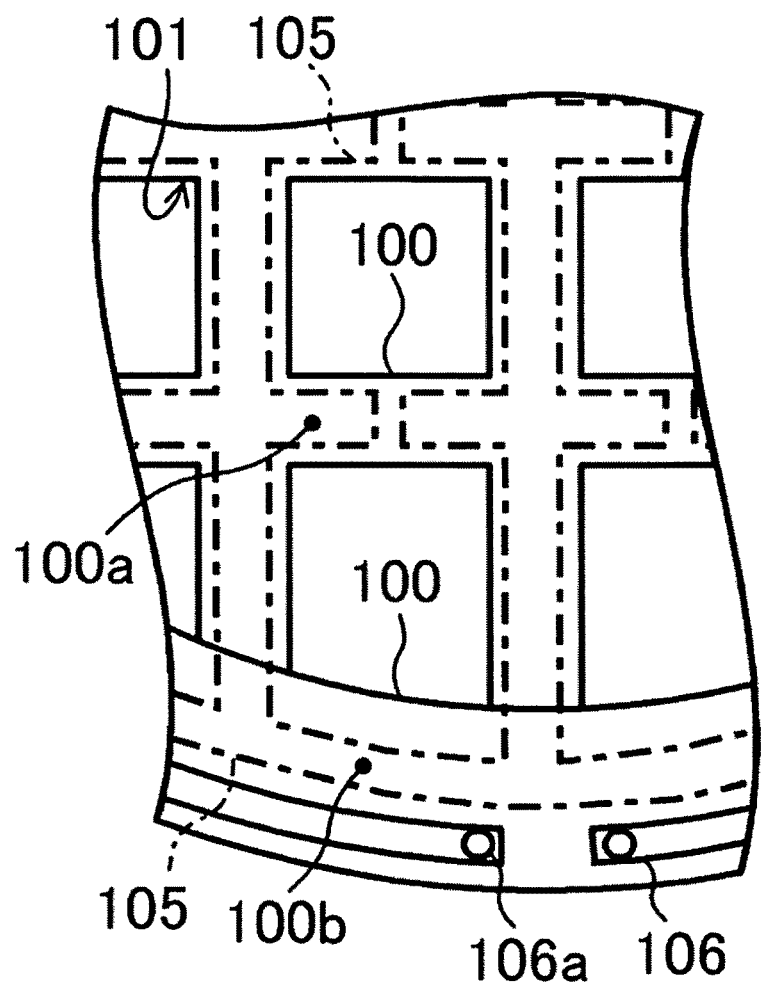
FIG. 6B is a magnified view of one section of FIG. 6A as seen from the dielectric window side.
Figure 6C:
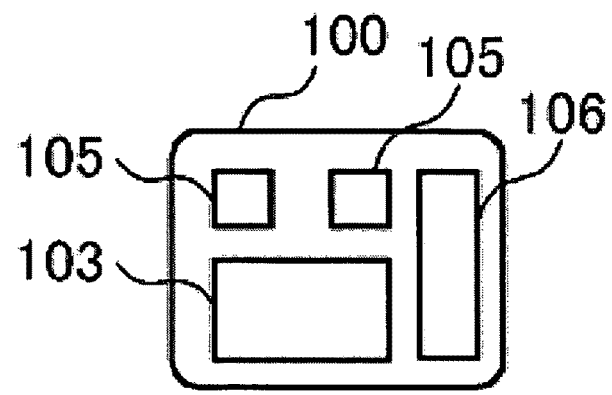
FIG. 6C is a cross sectional view of the line M-M shown in FIG. 6A.
Figure 6D:
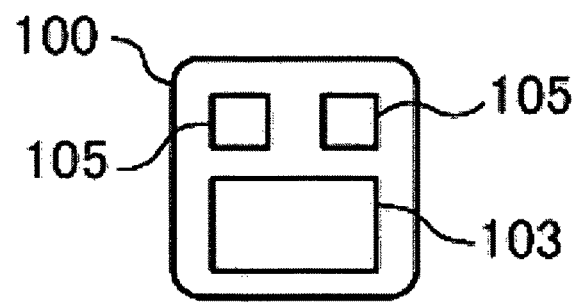
FIG. 6D is a cross sectional view of the line N-N shown in FIG. 6A.

FIG. 5 is a schematic configuration diagram showing a modified example of the plasma processing device which is a semiconductor manufacturing device according to the third embodiment of the present invention. FIG. 6A is a configuration diagram of a lower shower plate which is a temperature adjusting mechanism according to the third embodiment of the present invention, and is a plane view of a lower shower plate 10 provided in a plasma processing device 51 shown in FIG. 5 as seen from the processing container 2 side. FIG. 6B is a magnified view of one section of FIG. 6A, as seen from the dielectric window 3. FIG. 6C is a cross sectional view of the line M-M shown in FIG. 6A, and FIG. 6D is a cross sectional view of the line N-N shown in FIG. 6A.

The configuration of the plasma processing device 51 is almost similar to the plasma processing device 1 shown in the first embodiment. A lower shower plate 10 in which is a processing gas supply structure is provided between the retainer ring 2a and the lower container 2b of the processing container 2. The space S in the processing container 2 is intersected by the lower shower plate 10, and the lower space is defined as a space S1 and the upper space is defined as a space S2.

The lower shower plate 10 is provided with a frame 100, an opening 101, a gas supply port 102, a gas passage 103, a plurality of gas injection ports 104, and a heat lane 105. The frame 100 is a circular plate and its inside is made in the form of a grid. Inside the frame 100 are provided the gas passage 103 and the heat lane 105, and the gas passage 103 is provided at the processing substrate W side (that is, the space S1 side), and the heat lane 105 is provided at the dielectric window 3 side (that is, the space S2 side).

From the opening 101 of the space created by the grid of the frame 100 of the shower plate 10, it is possible to pass plasma or a processing gas contained in the plasma formed in the space S1. The gas supply port 102, gas passage 103 and the plurality of gas injection ports 104 are connected each other, and has a role of uniformly distributing a gas supplied from a processing gas source 14 over the entire region corresponding to the processing substrate W by releasing the gas into the space S1 via the lower shower plate 10.

The lower shower plate 10 is provided in the space between the retainer ring 2a of the processing container 2 and the lower container 2b, and the periphery of the lower shower plate 10 (outside a gas passage periphery 103b) is integrated to the wall of the processing container 2. To prevent the accumulation of heat in the lower shower plate 10 during the formation of plasma, a cooling channel 106 is provided in the periphery. By circulating a heat medium inside the cooling channel 106, the heat of the shower plate 10 is removed, and cooling occurs. Concretely, the heat medium is supplied from the chiller, enters through the flow passage inlet 106a, and exits from the flow passage outlet 106b via the cooling channel 106, and is returned again to the chiller. While flowing through the cooling channel 106, the heat from the peripheral section of the lower shower plate 10 is removed by the heat medium and cooled. By setting the temperature of the chiller beforehand, the retainer ring 2a can be cooled to a predetermined temperature. As a heat medium used in cooling, for example can be employed liquid heat exchange media such as silicone oil, fluorinated liquids, or ethylene glycol. By providing the cooling channel 106 in the periphery, it is possible to carry out cooling without any direct contact with either the space S1 or S2, and without affecting the formation condition (here, temperature conditions) of the plasma.

A heat lane 105 is constituted by providing a heat receiving section (vaporizer) 100a in the grid section of the frame 100 and a heat dissipating section (condenser) 100b in the periphery of the frame 100, and sealing a two-phase condensable working liquid (hereafter referred to as working liquid) in an annular narrow tube passing alternately in the space between them. The heat lane 105 is formed from one or a plurality of annular narrow tubes without interruption, and circulates the working liquid in each narrow tube. In this, the working liquid in the heat lane 105 is sealed at a pressure at which the working liquid undergoes a phase transition from the liquid phase to the vapor phase in the intended temperature range.

The heat dissipating section 100b is a section cooled by the cooling channel 106 and is located in the periphery (outside the gas passage periphery 103b) of the frame 100. The heat receiving section 100a is the grid section of a part of the frame 100 that is in contact with the space S1. Even when the cooling channel 106 is not provided, the periphery of the frame 100 is nearer to the outer space of the processing container 2, and without direct contact with the heat, etc., generated during the formation of plasma, as the temperature is lower than the center grid section, the periphery of the frame 100 becomes the heat dissipating section 100b, while the grid section becomes the heat receiving section 100a.

In the heat receiving section 100a of the heat lane 105, the working liquid absorbs heat and undergoes nucleate boiling, the working liquid self-excites, and transfers the sensible heat. Further, the working liquid absorbs heat in the heat receiving section 100a and undergoes phase transition from liquid phase to vapor phase, and undergoes cooling by releasing heat in the heat dissipating section 100b resulting in a phase transition from vapor phase to liquid phase, and due to these phase transitions of vapor and liquid, the latent heat is transferred. In this manner, a transfer of heat takes place between the heat receiving section 100a and the heat dissipating section 100b due to sensible heat transfer and latent heat transfer. Moreover, in the heat lane 105, since heat transfer normally occurs not only between the heat receiving section 100a and the heat dissipating section 100b but also wherever temperature difference exists, the temperature difference becomes small and it becomes possible to achieve uniform temperature in a short time.

The temperature differential of the lower shower plate 10 is mainly produced between the heat lane 105 and the cooling channel 106, that is, near the heat lane 105 located in the periphery of frame 100. Further, the temperature differential within the heat lane 105, that is within the grid section of the frame 100, is small. Since the frame 100 touches the space S1 and S2 in the grid section, in a case of generation of a temperature differential, there is a risk of effect of temperature on the treatment process (condition for generating plasma, etc.). However, the temperature differential is produced mainly in the periphery of the frame 100 provided with the cooling channel 106. Due to this, without affecting temperature in the spaces S1 and S2 where the treatment process occurs, the grid section of the frame 100 can be maintained almost at a uniform temperature.

Therefore, by resolving the temperature differential, the temperature distribution in the surface facing the processing substrate W of the lower shower plate 10 can be uniformed within a short duration. Although the heat received by the heat receiving section 100a is carried to the heat dissipating section 100b by heat transport and the heat continues to accumulate there, this accumulated heat can be removed by using a heat medium of the cooling channel 106 resulting in the cooling of the lower shower plate 10. Thus, the shower plate 10 provided with the heat lane 105, while carrying out cooling at a predetermined temperature in its inside, can uniform the temperature distribution within a short duration.

A method of plasma processing is briefly explained below. The processing container 2 of the plasma processing device 51 is sealed by the dielectric window 3. During this process, the inside of the processing container 2 is made into vacuum state by evacuating and reducing the pressure through the exhaust port 8a and the vacuum pump 8b.

Microwave is supplied from the microwave source via the waveguide 5. The microwave is radially transmitted between the wave guide section 4a and the radial line slot antenna 4b, and is radiated through the slot of the radial line slot antenna 4b.

During conversion to plasma by microwave, a plasma gas such as argon (Ar) or xenon (Xe) is supplied from the gas source 13 into the space S2 via the dielectric window 3. The plasma produced in the space S2 or the processing gas contained in the plasma is passed into the space S1 through the opening 101 of the lower shower plate 10.

From the processing gas source 14 and via the lower shower plate 10, a process gas such as a fluorocarbon gas (C3F6) or an etching gas, etc., is distributed uniformly over the entire area corresponding to the processing substrate W in the space S1. By the microwave excitation of plasma occurring only in the space 2, and by activating the process gas in the space S1 containing the surface of the processing substrate W with the plasma diffusing from the space S2, it is possible to provide a plasma treatment to the processing substrate W kept on the substrate holder 7. Further, since the processing substrate W is not exposed directly to microwave during plasma ignition, the failure rate can be reduced. As plasma processing, for example, so-called CVD (Chemical Vapor Deposition) is carried out for forming a film such as an insulation film on the processing substrate W. By repeating a series of operations like bringing in the processing substrate W and transporting after plasma treatment, a predetermined substrate processing is carried out for a predetermined number of substrates.

During the formation of plasma, the dielectric window 3 and the vicinity of the dielectric window 3 assume high temperature, and the lower shower plate 10 made from a material such as Al, or materials such as ceramic also assumes high temperature, and due to an accumulation of heat, a temperature distribution may easily occur. If a temperature distribution is produced in the vicinity of the space S1 where the plasma is formed, the formation of plasma becomes unstable. With the heat lane 105 provided in the lower shower plate 10, as it is possible to achieve uniform temperature distribution in a short period, and maintain at a predetermined temperature by cooling, it is possible to maintain an optimal condition for formation of plasma.

The dielectric window 3 of the plasma processing device 1 shown in the first embodiment or the second embodiment is a plate member with which the ceiling of the plasma processing container can be covered, and the processing container can be sealed. In addition, the dielectric window 3 can be made of a dielectric material, provided with a passage that can not only transmits microwave but can also supplies a gas, and be also made to function as a shower plate that emits the gas used in plasma processing inside the chamber.

In the lower shower plate 10 of the plasma processing device 51 shown in the third embodiment, if it can divide the space without blocking the atmosphere, the opening is not limited to grid form, and can also be circular or diamond shape. In the lower shower plate 10, it is desirable to provide a gas passage for a plasma gas in a plane in the side of a processing object, and provide a narrow tube sealed with a working liquid as the temperature adjusting mechanism in a plane outside the processing object in close proximity to the gas passage. By providing the lower shower plate 10, there is no risk of exposing the plasma atmosphere to the processing object, even a plasma gas whose excess dissociation needs to be suppressed can be supplied more efficiently, a uniform temperature distribution of the plasma can be achieved, and optimal conditions for plasma formation can be maintained. In the third embodiment, although the temperature adjusting mechanism is provided only to the lower shower plate 10, it is also possible to combine the temperature adjusting mechanisms shown in the first or the second embodiments.

Further, the plasma processing device and the temperature adjusting mechanism described in the embodiments are an example, and are not limited to these. It is possible to optionally set the number of division or assignment of area when dividing the temperature adjusting mechanism (the cooling jacket, the retainer ring, the shower plate, etc.) into several sections, or the shapes and arrangements of the plurally provided heat lanes and the configuration of the cooling passage, etc. With the cooling channel as the center, in addition to the case of providing symmetrical heat lanes on its left and right, the heat lane may also be provided on only one side, or it need not have right-left symmetry, and it does not matter even if the shape or returning length of the heat lane is not equal. In the heat lane, since the section having lower temperature functions as a heat dissipating section, and the section having higher temperature compared to the heat dissipating section functions as a heat receiving section, even the locations of the heat dissipating section and the heat receiving section provided at the heat lane can be arbitrarily set depending on the location of the heat exchanger provided at the heat lane, or based on high/low of the set temperature.

Further, it is also possible to use in combination of the temperature adjusting mechanisms described in the embodiments, or even provide a temperature adjusting mechanism using the heat lane in the dielectric window or the substrate holder, etc. In addition, apart from the above-mentioned temperature adjusting mechanism provided with the heat lane, a heating-cooling device which can control temperature may also be provided. With the heating-cooling device, it becomes possible to control the temperature to a predetermined temperature in a short duration, and also broaden a range width of the predetermined temperature. By joint use of the separately provided heating-cooling device and the temperature adjusting mechanism provided with the heat lane, it becomes possible to obtain a predetermined temperature in a short duration and achieve uniform temperature distribution.

Further, it is also possible to optionally choose and set a configuration of the plasma processing device, the plasma processing method, the gases employed in the plasma treatment, the substrate to be treated, and the temperature adjustment cooling means, etc. Without limiting to a plasma processing device, the temperature adjusting mechanism provided with the heat lane may also be provided in other devices employed in other processes in the manufacture of semiconductors. It is particularly useful in semiconductor manufacturing requiring temperature distribution in a short time, such as where processes which are easily prone to failure due to temperature distribution are included, or where a product of more stable quality is demanded, etc. As an example of semiconductor manufacturing device can be offered thermal film deposition equipment used in forming a thin oxide film on a wafer, or a device for carrying out coating and development of photosensitive agents (photoresists). It can also be a semiconductor manufacturing device provided with a processing unit that is comprised of several processing units for performing plasma treatment. As examples of other than a semiconductor manufacturing device, an FPD manufacturing device or a solar cell manufacturing device can be offered. The device employing the temperature adjusting mechanism provided with the heat lane is not limited to the examples described in the embodiments above, and it is possible to optionally select, and various embodiments are possible.

This application is based on the Japanese Patent Application No. 2008-175590 filed on Jul. 4, 2008. All the specification, claims and drawings of the Japanese Patent Application No. 2008-175590 are incorporated in the present specification by reference.

EXPLANATION OF NUMBERS

1 Plasma processing device
2 Processing container (chamber)
2a Retainer ring
3 Dielectric window
4 Antenna
5 Waveguide
6 Cooling jacket
10 Lower shower plate
21, 62, 67, 105 Heat lane
22a, 22b, 63, 68, 100a Heat receiving section (vaporizer)
23, 64, 69, 100b Heat dissipating section (condenser)
24, 61, 66, 106 Cooling channel
W Processing substrate

The invention claimed is:

1. A temperature adjusting mechanism for controlling a temperature of a dielectric window provided within a semiconductor manufacturing device, the temperature adjusting mechanism comprising:
a narrow annular tube positioned alongside an outer surface of a processing device housing a processing object; and
a two-phase condensable working liquid of vapor and liquid sealed in the narrow annular tube,
wherein the narrow annular tube comprises:
a heat receiving section in which the two-phase condensable working liquid absorbs heat and undergoes phase transition from liquid phase to vapor phase; and
a heat dissipating section in which the two-phase condensable working liquid releases heat and undergoes phase transition from vapor phase to liquid phase,
wherein a cooling channel is provided over at least part of said heat dissipating section,
the narrow annular tube and the cooling channel are in separate cooling circuits,
a heat medium which is different from the two-phase condensable working liquid is circulated inside the cooling channel, and
the two-phase condensable working liquid inside the heat dissipating section releases heat to the cooling channel, and
wherein the narrow annular tube and the cooling channel are provided within a plate-shaped cooling jacket installed above the dielectric window,
the cooling channel is provided at a peripheral portion of the plate-shaped cooling jacket, and
the narrow annular tube is extended from a central portion of the plate-shaped cooling jacket to the peripheral portion of the plate-shaped cooling jacket.

2. The temperature adjusting mechanism according to claim 1, wherein the narrow annular tube is installed by meandering.

3. The temperature adjusting mechanism according to claim 2, wherein a distance between the cooling channel and an inner surface of the processing device is more than a distance between the narrow annular tube and said inner surface of the processing device.

4. The temperature adjusting mechanism according to claim 1, wherein the temperature adjusting mechanism is divided into a plurality of sections each having an independent narrow annular tube.

5. The temperature adjusting mechanism according to claim 4, wherein each of said plurality of sections is provided with the cooling channel over at least part of the independent narrow annular tube.

6. The temperature adjusting mechanism according to claim 4, wherein the temperature of each of said plurality of sections can be adjusted independently to a predetermined temperature.

7. The temperature adjusting mechanism according to claim 1, wherein the narrow annular tube is positioned over a plate shape member sealing an upper portion of a processing container.

8. The temperature adjusting mechanism according to claim 7, wherein the narrow annular tube is further positioned at an upper portion of a side wall of the processing container.

9. The temperature adjusting mechanism according to claim 7, wherein the narrow annular tube meanders by folding between a center and a peripheral edge of the plate shape member.

10. The temperature adjusting mechanism according to claim 9, wherein the cooling channel is provided in proximity of the peripheral edge of said plate shape member.

11. The temperature adjusting mechanism according to claim 7, wherein the cooling channel extends from a center portion to a peripheral portion of the plate shape member.

12. The temperature adjusting mechanism according to claim 1, wherein the narrow annular tube is positioned at an upper portion of a side wall of a processing container.

13. A temperature adjusting mechanism for controlling a temperature of a lower shower plate provided within a semiconductor manufacturing device, the temperature adjusting mechanism comprising:
a narrow annular tube positioned within the lower shower plate located inside a processing container; and
a two-phase condensable working liquid of vapor and liquid sealed in the narrow annular tube,
wherein the narrow annular tube comprises:
a heat receiving section in which the two-phase condensable working liquid absorbs heat and undergoes phase transition from liquid phase to vapor phase; and
a heat dissipating section in which the two-phase condensable working liquid releases heat and undergoes phase transition from vapor phase to liquid phase,
wherein a cooling channel is provided over at least part of said heat dissipating section,
the narrow annular tube and the cooling channel are in separate cooling circuits,
a heat medium which is different from the two-phase condensable working liquid is circulated inside the cooling channel, and
the two-phase condensable working liquid inside the heat dissipating section releases heat to the cooling channel, and
wherein the narrow annular tube and the cooling channel are provided within the lower shower plate installed below a dielectric window provided within the semiconductor manufacturing device,
the cooling channel is provided at a peripheral portion of the lower shower plate, and
the narrow annular tube is extended from a central portion of the lower shower plate to the peripheral portion of the lower shower plate.

14. The temperature adjusting mechanism according to claim 13, wherein the lower shower plate includes a circular grid frame comprising the narrow annular tube and a processing gas supply structure for plasma treatment.

15. A semiconductor manufacturing device comprising:
a processing container;
a dielectric window; and
a temperature adjusting mechanism for minimizing for controlling a temperature of the dielectric window, wherein the temperature adjusting mechanism comprises:
a narrow annular tube positioned alongside an outer surface of the semiconductor manufacturing device; and
a two-phase condensable working liquid of vapor and liquid sealed in the narrow annular tube,
wherein the narrow annular tube comprises:
a heat receiving section in which the two-phase condensable working liquid absorbs heat and undergoes phase transition from liquid phase to vapor phase; and
a heat dissipating section in which the two-phase condensable working liquid releases heat and undergoes phase transition from vapor phase to liquid phase,
wherein a cooling channel is provided over at least part of said heat dissipating section,
the narrow annular tube and the cooling channel are in separate cooling circuits,
a heat medium which is different from the two-phase condensable working liquid is circulated inside the cooling channel, and
the two-phase condensable working liquid inside the heat dissipating section releases heat to the cooling channel, and
wherein the narrow annular tube and the cooling channel are provided within a plate-shaped cooling jacket installed above the dielectric window,
the cooling channel is provided at a peripheral portion of the plate-shaped cooling jacket, and
the narrow annular tube is extended from a central portion of the plate-shaped cooling jacket to the peripheral portion of the plate-shaped cooling jacket.

16. The semiconductor manufacturing device according to claim 15, wherein the narrow annular tube is positioned over a plate shape member sealing an upper portion of the processing container.

17. The semiconductor manufacturing device according to claim 15, wherein the narrow annular tube is positioned at an upper portion of a side wall of the processing container.

* * * * *

UNITED STATES PATENT AND TRADEMARK OFFICE
CERTIFICATE OF CORRECTION

| | | |
|---|---|---|
| PATENT NO. | : 8,968,512 B2 | Page 1 of 1 |
| APPLICATION NO. | : 12/737310 | |
| DATED | : March 3, 2015 | |
| INVENTOR(S) | : Shinya Nishimoto | |

It is certified that error appears in the above-identified patent and that said Letters Patent is hereby corrected as shown below:

In the claims,

Column 19, claim 15, line 4 please replace "mechanism for minimizing for" with -- mechanism for --

Signed and Sealed this
Twenty-eighth Day of July, 2015

Michelle K. Lee
*Director of the United States Patent and Trademark Office*